United States Patent
Ko et al.

(10) Patent No.: US 7,466,027 B2
(45) Date of Patent: Dec. 16, 2008

(54) INTERCONNECT STRUCTURES WITH SURFACES ROUGHNESS IMPROVING LINER AND METHODS FOR FABRICATING THE SAME

(75) Inventors: Chung-Chi Ko, Nantou County (TW); Keng-Chu Lin, Pingtung County (TW); Chia-Cheng Chou, Keelung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 87 days.

(21) Appl. No.: 11/531,304

(22) Filed: Sep. 13, 2006

(65) Prior Publication Data

US 2008/0061442 A1    Mar. 13, 2008

(51) Int. Cl.
*H01L 23/48*    (2006.01)
*H01L 21/4763*    (2006.01)

(52) U.S. Cl. .............................. 257/774; 257/E23.145; 257/E23.167; 257/E23.161; 257/E23.116; 257/E21.579; 257/680; 257/773; 257/758; 438/629

(58) Field of Classification Search ................. 257/774, 257/E23.145, E23.167, E23.161, E21.579, 257/E23.116, 680, 773, 758; 438/629
See application file for complete search history.

(56) References Cited

U.S. PATENT DOCUMENTS

| | | | |
|---|---|---|---|
| 6,603,204 B2 * | 8/2003 | Gates et al. ................. | 257/760 |
| 6,677,680 B2 * | 1/2004 | Gates et al. ................. | 257/758 |
| 6,716,742 B2 * | 4/2004 | Gates et al. ................. | 438/623 |
| 6,831,366 B2 * | 12/2004 | Gates et al. ................. | 257/760 |
| 6,878,615 B2 * | 4/2005 | Tsai et al. .................... | 438/618 |
| 6,917,108 B2 * | 7/2005 | Fitzsimmons et al. ........ | 257/751 |
| 2006/0027929 A1 * | 2/2006 | Cooney et al. .............. | 257/758 |
| 2006/0099802 A1 * | 5/2006 | Lin et al. ..................... | 438/637 |
| 2006/0154464 A1 * | 7/2006 | Higashi ....................... | 438/597 |
| 2006/0216932 A1 * | 9/2006 | Kumar et al. ................ | 438/641 |
| 2007/0032068 A1 * | 2/2007 | Ogawa ........................ | 438/622 |
| 2007/0082132 A1 * | 4/2007 | Shinriki et al. ......... | 427/255.394 |
| 2007/0096321 A1 * | 5/2007 | Raaijmakers et al. ........ | 257/758 |
| 2007/0284746 A1 * | 12/2007 | Lopatin et al. .............. | 257/752 |

\* cited by examiner

*Primary Examiner*—Alexander O Williams
(74) *Attorney, Agent, or Firm*—Thomas, Kayden, Horstemeyer & Risley

(57) ABSTRACT

Interconnect structures are provided. An exemplary embodiment of an interconnect structure comprises a substrate with a low-k dielectric layer thereon. A via opening and a trench opening are formed in the low-k dielectric layer, wherein the trench opening is formed over the via opening and the via opening exposes a portion of the substrate. A liner layer is formed on sidewalls of the low-k dielectric layer exposed by the trench and via protions and a bottom surface exposed by the trench via portion, wherein the portion of the liner layer on sidewalls of the low-k dielectric layer exposed by the trench and via protions and the portion of the liner layer formed on a bottom surface exposed by the trench portion comprise different materials. A conformal conductive barrier layer is formed in the trench and via openings, covering the liner layer and the exposed portion of the substrate. A conductive layer is formed on the conductive barrier layer, filling in the trench and via openings.

21 Claims, 4 Drawing Sheets

INTERCONNECT STRUCTURES WITH SURFACES ROUGHNESS IMPROVING LINER AND METHODS FOR FABRICATING THE SAME

BACKGROUND OF THE INVENTION

1. Field of the Invention

The present invention relates to relates to semiconductor fabrication, and in particular to an interconnect structure with improved adhesion between a low-k dielectric layer and a diffusion barrier layer therein.

2. Description of the Related Art

Electrically conductive lines for tasks such as signal transferring are essential in electronic devices as well as in semiconductor integrated circuit (IC) devices. The electrically conductive lines on different levels are connected by electrically conductive plugs in required positions and provide predetermined functions.

Recently, fabrication using copper has been introduced to solve problems such as RC delay caused by device feature size reduction responding to demands of increased device integrity. Moreover, copper also shows better heat conductivity, thus providing better electromigration resistance than conventional aluminum. Copper fabrication compatible with low dielectric constant (low-k) dielectric material has become a leading interconnect process in the IC industry.

In the copper fabrication, a metal barrier layer comprising material such as Ta or TaN is needed and formed between the copper and adjacent low-k dielectric material to suppress undesired copper diffusion. Low-k dielectric materials, however, have characteristics that make it difficult to integrate them into existing integrated circuit structures and processes. Compared to the conventional silicon dioxide ($SiO_2$), low-k materials, due to the inherent properties thereof, typically have disadvantages such as low mechanical strength, high moisture absorption, poor adhesion, and unstably stress levels and are easily damaged by fabrication processes such as etching, ashing and cleaning used in copper fabrication. In addition, low-k materials used in the copper fabrication are often formed with a certain porosity to reduce the dielectric constant thereof. Therefore, when an opening for forming an interconnect structure is defined in the low-k dielectric material, sidewalls with poor surface roughness are often formed, especially when the low-k materials are formed with a certain porosity for the purpose of reducing the dielectric constant thereof, thus causing poor adhesion between the low-k materials and the sequential formed metal barrier layer of a subsequently formed copper interconnect structure results and may affect reliability thereof.

BRIEF SUMMARY OF THE INVENTION

To improve adhesion between the low-k dielectric layer and the diffusion barrier in an interconnect structure of and methods for fabricating the same are provided. An exemplary embodiment of an interconnect structure comprises a substrate with a low-k dielectric layer thereon. A via opening and a trench opening are formed in the low-k dielectric layer, wherein the trench opening is formed over the via opening and the via opening exposes a portion of the substrate. A liner layer is formed on sidewalls of the low-k dielectric layer exposed by the trench and via protions and a bottom surface exposed by the trench via portion, wherein the portion of the liner layer on sidewalls of the low-k dielectric layer exposed by the trench and via protions and the portion of the liner layer formed on a bottom surface exposed by the trench portion comprise different materials. A conformal conductive barrier layer is formed in the trench and via openings, covering the liner layer and the exposed portion of the substrate. A conductive layer is formed on the conductive barrier layer, filling in the trench and via openings.

Another exemplary embodiment of a method for fabricating an interconnect structure comprises providing a substrate with a low-k dielectric layer thereon. An opening is formed in the low-k dielectric layer, comprising a via portion and a trench portion, wherein the trench portion is formed over the via opening and the via portion exposes a portion of the substrate. A liner layer is formed on sidewalls of the low-k dielectric layer exposed by the trench and via protions and a bottom surface exposed by the trench via portion, wherein the portion of the liner layer on sidewalls of the low-k dielectric layer exposed by the trench and via protions and the portion of the liner layer formed on a bottom surface exposed by the trench portion comprise different materials. A conductive barrier layer is formed in the trench and via poritons, conformally covering the liner layer and the exposed portion of the substrate. A conductive layer is formed on the conductive barrier layer, filling in the trench and via openings.

An exemplary embodiment of a semiconductor structure comprises a dual damascene structure and a passivation layer formed thereover. The dual damascene structure comprises a substrate with a low-k dielectric layer thereon. A via opening and a trench opening are formed in the low-k dielectric layer, wherein the trench opening is formed over the via opening and the via opening exposes a portion of the substrate. A liner layer is formed on sidewalls of the low-k dielectric layer exposed by the trench and via portions and a bottom surface exposed by the trench via portion, wherein the portion of the liner layer on sidewalls of the low-k dielectric layer exposed by the trench and via portions and the portion of the liner layer formed on a bottom surface exposed by the trench portion comprise different materials. A conformal conductive barrier layer is formed in the trench and via openings, covering the liner layer and the exposed portion of the substrate. A conductive layer is formed on the conductive barrier layer, filling in the trench and via openings.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

In this specification, expressions such as "over the substrate", "over the layer", or "on the layer" simply denote a relative positional relationship with respect to the surface of the base layer, regardless of the existence of intermediate layers. Accordingly, these expressions may indicate not only the direct contact of layers, but also, a non-contact state of one or more laminated layers. Use of the term "low dielectric constant" or "low-k" herein, refers to a dielectric constant (k value) which is less than the dielectric constant of a conventional silicon oxide. Preferably, the low-k dielectric constant o is less than about 4.0.

FIGS. 1-5 are cross sections of a portion of a substrate during fabrication of an semiconductor structure according to an embodiment of the invention, showing a method for fabricating an semiconductor structure with improved reliability.

Figure 1:
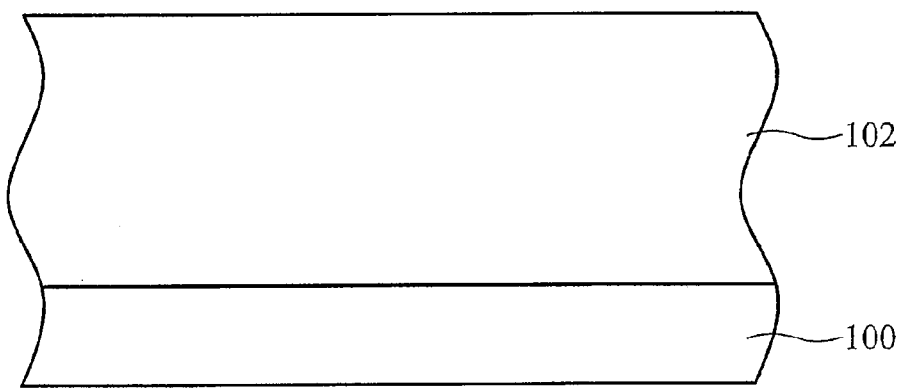
FIGS. 1-5 are cross sections showing a method for fabricating a semiconductor structure according to an embodiment of the invention.

In FIG. 1, a semiconductor substrate 100, for example a silicon substrate, with semiconductor devices (not shown) or other existing conductive lines thereon (not shown) is first provided. The substrate 100 is illustrated as a flat substrate here for simplicity. The semiconductor substrate 100 can also be provided with a conductive member (not shown) for electrically connecting one of the underlying semiconductor devices or conductive lines. A low-k dielectric layer 102 is then formed over the semiconductor substrate 100 by methods such as chemical vapor deposition (CVD), spin coating or the like. The low-k dielectric layer 102 comprises low-k dielectric materials with an inherent dielectric constant lower than the undoped silicon dioxide which is about 4.0 such as carbon-doped silicon dioxide materials, fluorinated silicate glass (FSG), organic silicate glass (OSG), fluorine doped silicon oxide, spin-on glasses, silsesquioxane, benzocyclobutene (BCB)-based polymer dielectrics and any silicon containing low-k dielectric. The low-k dielectric layer 102 may also be formed with a plurality pores (not shown) therein and has an overall porosity of about 5~50% for the purpose of reducing the dielectric constant thereof. For comparison, a dielectric layer with no pores therein has a porosity of 5% or less. Normally, the low-k dielectric layer 102 is formed at a thickness of about 1000~6000 Å.

Figure 2:
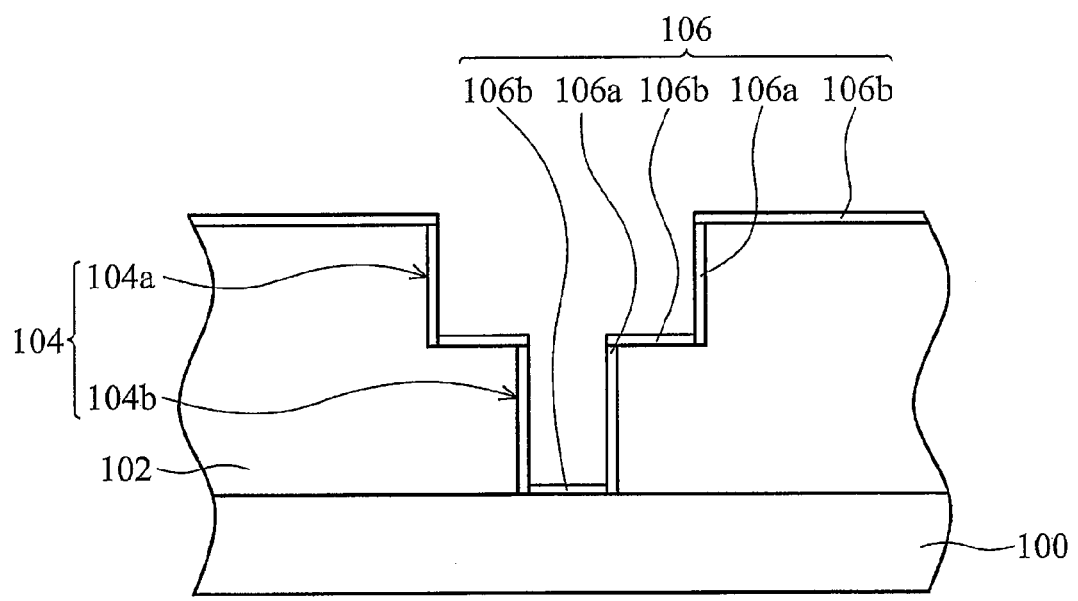

In FIG. 2, an opening 104 composed of a lower via opening 104b and an upper trench opening 104a is then formed in the low-k dielectric layer 102 using techniques such as a dual damascene process or similar. The opening 104 exposes a portion of the semiconductor substrate 100. The opening 104 can be formed by a trench first dual damascene process or via first dual damascene process, for example. An optional etch stop layer (not shown) can be further formed in the low-k dielectric layer 102 to provide etch stop when forming the opening 104. During the formation of the opening 104, material of the low-k dielectric layer 102 is treated in fabrication processes such as photoresist ashing process, low-k dielectric etching process and wafer cleaning process, thereby forming the opening 104 exposing sidewalls with poor surface roughness in the low-k dielectric layer 102, particularly when the low-k dielectric layer 102 uses porous low-k dielectric materials. This is disadvantageous to adhesion of a following diffusion barrier layer. Next, a liner layer 106 is conformably formed over the low-k dielectric layer 102 and in the opening 104, also covering the exposed portion of the semiconductor substrate 100. The liner layer 106 is formed at a thickness of about 30~100 Å and can be formed by methods such as chemical vapor depositions (CVD) or the like. Preferably, the liner layer 106 is formed by plasma enhanced CVD (PECVD). The PECVD may use reactants such as organic silane, $NH_3$ and dilute/carrier gases such as argon, helium or nitrogen at a temperature of about 200~450° C., and may be performed under a pressure of about 1~10 Torr and a power of about 50-550 W and deposition rate 1~10 Å/sec. Preferably, the PECVD is performed under a power of about 50-200 W. Flow rates of the described reactants are about 200~2000 sccm for organic silane, 100~1000 sccm for $NH_3$ and 100~10000 sccm for the dilute/carrier gases. The organic silane for forming the liner layer 106 can be, for example, $SiH_4$, $SiH_3(CH_3)$, $SiH_2(CH_3)_2$ or $SiH(CH_3)_3$. Therefore, the liner layer 106 may by comprised of two main portions 106a and 106b containing different materials here, wherein the portions 106a formed on the sidewalls in the opening 104 may comprise SixCyH and the portions 106b formed on a bottom surface and a top surface of the opening 104 may comprise SixCyNzH. The liner layer 106 is formed with a surface roughness less than that of the above processed low-k dielectric layer 102, thereby providing a smooth surface on of the low-k dielectric layer 102 and the portions 106b formed on the bottom surface of the low-k dielectric layer 102 exposed by the trench opening 104a may also fix or protect thereof to thereby provide an improved surface flatness after formation of the via opening 104b. In addition, since the portions 106a of the liner layer 106 formed on sidewalls of the opening 104 now comprises nitrogen-free material, effective dielectric constant of the low-k dielectric layer 102 will not be increased.

Figure 3:
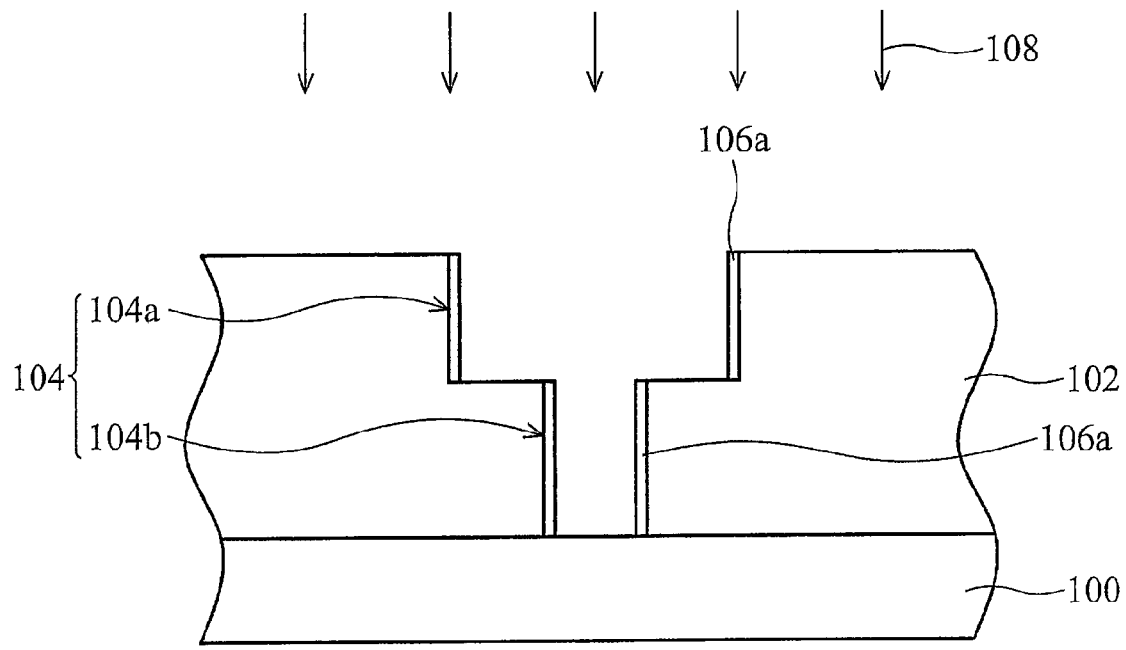

In FIG. 3, an etching step 108 is performed on the liner layer 106 to remove the portion of the liner layer 106 above the opening 104 and above the exposed portion of the semiconductor substrate 100, thereby leaving the liner layer 106a on sidewalls in the trench and via opening 104a, 104b, and exposes a portion the semiconductor substrate 100. The etching 108 uses etching chemicals such as $CF_4$, Ar and $O_2$ at a temperature of about 0~50° C., a pressure of about 0.1~0.3 Torr and a power of about 400~800 W. Flow rates of the described reactants can be, for example, 50~300 sccm for $CF_4$, 0~300 sccm for Ar and 0~10 sccm for $O_2$.

Figure 4:
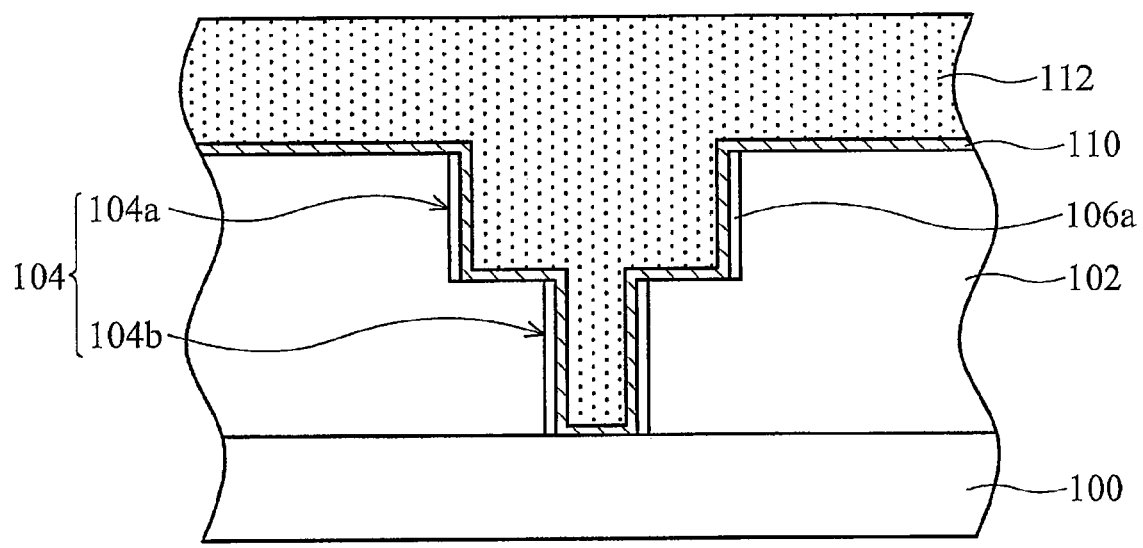
Figure 5:
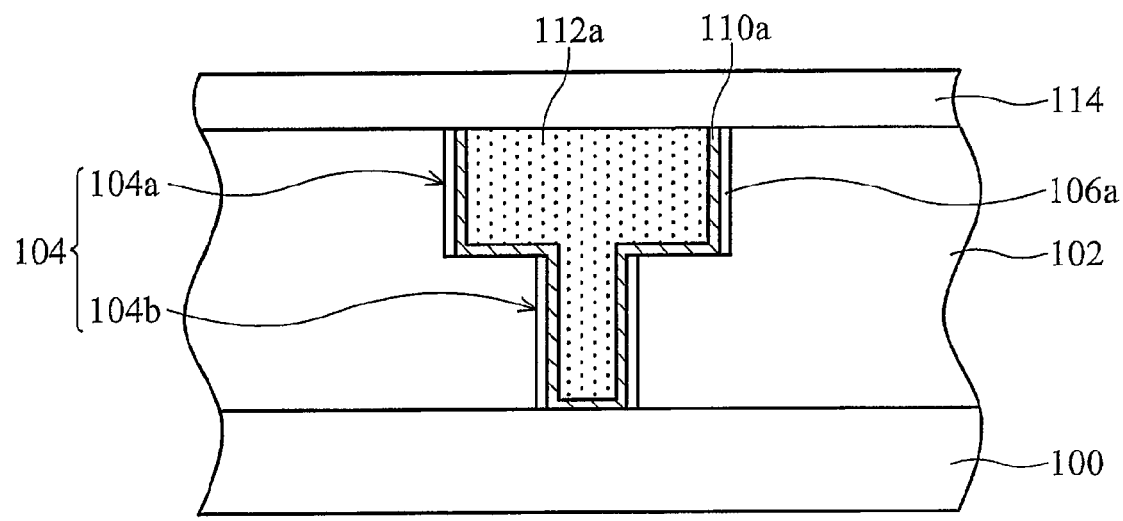

In FIG. 4, a conductive layer 110 is conformably formed over the low-k dielectric layer 102 and in the opening 104 as a diffusion barrier against of the sequentially formed conductive materials such as copper. The conductive layer 110 is formed at a thickness of about 50-300 Å and comprise materials such as Ta, TaN or combination thereof. Next, a conductive material 112 such as copper or copper aluminum alloy is formed over the low-k dielectric layer 102 and fills the opening 104. A planarization step such as chemical mechanical polishing (CMP) is then performed to remove the portion of the conductive material 112 and the conductive layer 110 above the low-k dielectric layer 102, thus leaving the conductive layer 112a and the adjacent diffusion barrier layer 110a in the opening 104, as shown in FIG. 5, thereby forming an interconnect structure. Next, a passivation layer 114, for example a silicon nitride layer, can be sequentially formed over the interconnect structure to thereby form a semiconductor structure. The passivation layer 114 may function as a topmost passivation layer for preventing moisture absorption, mechanical scratches or other undesired issue degrading the semiconductor structure. To those skilled in the art, other structures such as a contact pad structure and other interconnect structures may be formed between the passivation layer 114 and the underlying interconnect structure illustrated in FIG. 5 but is not illustrated here, for simplicity.

Thus, as shown in FIG. 5, a semiconductor structure with a more reliable interconnect structure is obtained since surface roughness between the low-k dielectric layer 102 and the diffusion barrier layer 110a is improved by the formation of the line layer 106a provided therebetween.

Figure 6:
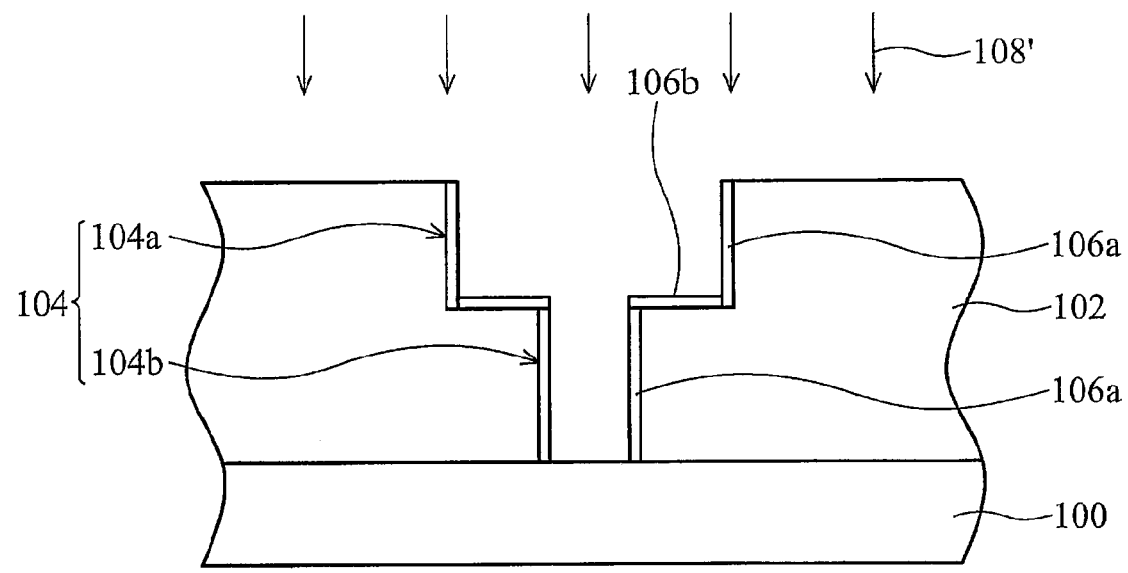
FIGS. 6-7 are cross sections showing a method for fabricating a semiconductor structure according to another embodiment of the invention.
Figure 7:
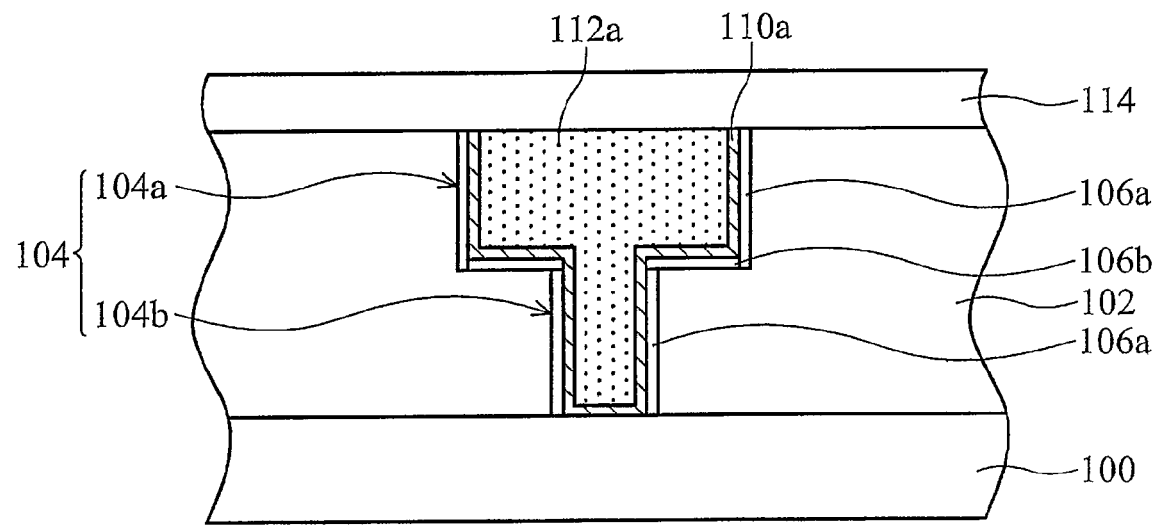

FIGS. 6-7 are cross sections of a portion of a substrate during fabrication of a semiconductor structure according to another embodiment of the invention showing a method for fabricating an semiconductor structure with improved reliability, wherein a different etching 108' is performed on the liner layer 106 in FIG. 2.

In FIG. 6, an etching 108' different to that illustrated in FIG. 3 is performed to mainly remove the portion 106b of the liner layer 106 on the exposed portion of the semiconductor substrate 100 and the low-k dielectric layer 102 but only partially remove the portion 106b of the liner layer 106 formed on the planar surface of the trench opening 104b, thereby leaving the portions 106a of the liner layer 106 on sidewalls of the opening 104 and the portions 106b of the liner layer 106 on the bottom surface of the trench opening 104a. The opening 104 exposes a portion of the semiconductor substrate 100. Herein, the portions 106b of the liner layer 106 are thinned in the etching 108' to a thickness of about 10~50 Å but not entirely removed. The liner layer the portions 106b of the liner layer 106 are thinner than that of the portions 106a of the liner layer 106 formed over sidewalls exposed by the trench opening 104a and the via opening 104b. The portions 106b formed on the bottom surface of the low-k dielectric layer 102 exposed by the trench opening 104a may fix or protect thereof to thereby provide an improved surface flatness after formation of the via opening 104b. In addition, the portions 106a of the liner layer 106 formed on sidewalls of the opening 104 may comprises nitrogen-free material and effective dielectric constant of the dielectric layer 102 will not be increased. The etching 108' uses etching chemicals such as $CF_4$, Ar and $O_2$ at a temperature of about 0~50° C., a pressure of about 0.1~0.3 Torr and a power of about 400-800 W. Flow rates of the described reactants are about 50~300 sccm for $CF_4$, 0~300 sccm for Ar and 0~10 sccm for $O_2$.

Next, a conductive diffusion barrier layer 110a and a conductive layer 112a are formed in the opening 104 through the processes illustrated in FIGS. 4-5, thereby forming an interconnect structure. The passivation layer 114 illustrated in FIG. 5 can be next formed over the interconnect structure to thereby form a semiconductor structure. Therefore, a semiconductor structure with another reliable interconnect structure is formed, since surface roughness between the low-k dielectric layer 102 and the diffusion barrier layer 110a is improved by the formation of the portions 106a and 106b of the liner layer 106 formed therebetween.

Figure 8:
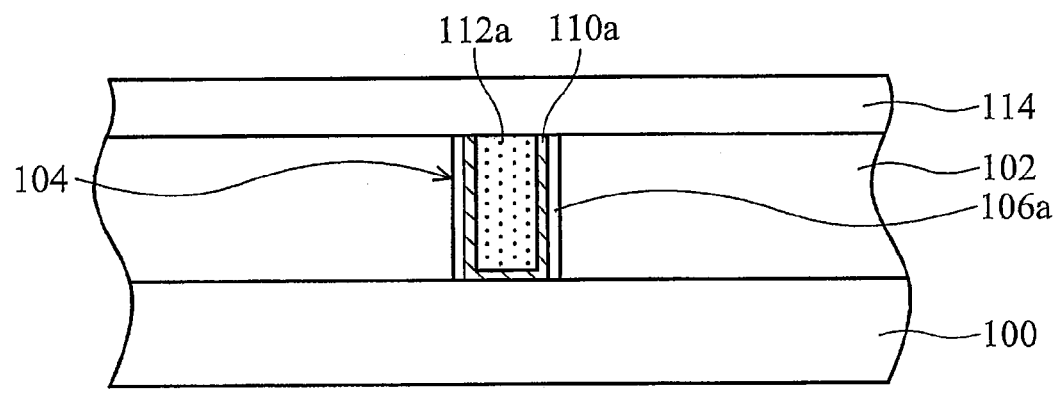
FIG. 8 is a cross section showing a semiconductor structure according to yet another embodiment of the invention.

The methods for fabricating semiconductor structures with an interconnect structure with improved adhesion between low-k dielectric layers and diffusion barrier layers therein as illustrated in FIGS. 1-5 and FIGS. 6-7, respectively, are applicable to fabricate a single damascene interconnect structure as that illustrated in FIG. 8, wherein same labels represent the same device elements.

The semiconductor structures and interconnect structures fabricated by the method of the invention, as shown in FIGS. 5 and 7, each comprises a substrate with a low-k dielectric layer thereon. An opening is formed in the low-k dielectric layer, exposing a portion of the substrate and sidewalls in the low-k dielectric layer. A liner layer is formed on at least sidewalls of the low-k dielectric layer in the opening. A conformal conductive barrier layer is formed in the opening, covering each of the liner layer and the exposed portion of the substrate. A conductive layer is formed over the conductive barrier layer, filling in the opening. According to an exemplary embodiment, the liner layer formed on sidewalls of the low-k dielectric layer comprises nitrogen-free material to thereby form a composite dielectric layer with no increased dielectric constant. According to another exemplary embodiment, the liner layer further forms over the bottom surface of a trench portion of the opening to thereby fix or protect thereof after formation of a via portion of the opening. A passivation layer can be further provided over the interconnect structure to thereby form a semiconductor structure.

The invention provides improved adhesion between a low-k dielectric layer and a diffusion barrier through formation of a liner layer formed at least vertical sidewalls in an opening for forming an interconnect structure to thereby smooth the surface which may damaged in certain processes for forming the opening such as ashing, etching, and cleaning. Therefore, a sequentially formed diffusion barrier layer can be formed in the opening with improved adhesion between the adjacent low-k dielectric layer, particularly when the adjacent low-k dielectric layer is formed with certain porosity. Thus, a semiconductor structure with an interconnect structure with improved reliability, such as in line-to-line leakage, time dependant dielectric breakdown (TDDB), RC delay or electromigration (EM) can be obtained.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An interconnect structure, comprising:
   a substrate with a low-k dielectric layer thereon;
   a via opening and a trench opening formed in the low-k dielectric layer, wherein the trench opening is formed over the via opening and the via opening exposes a portion of the substrate;
   a liner layer formed on sidewalls of the low-k dielectric layer exposed by the trench and via portions and a bottom surface exposed by the trench via portion, wherein the portion of the liner layer on sidewalls of the low-k dielectric layer exposed by the trench and via portions and the portion of the liner layer formed on a bottom surface exposed by the trench portion comprise different materials;
   a conformal conductive barrier layer formed in the trench and via openings, covering the liner layer and the exposed portion of the substrate; and
   a conductive layer formed on the conductive barrier layer, filling in the trench and via openings.

2. The interconnect structure as claimed in claim 1, wherein the low-k dielectric layer comprises porous low-k material.

3. The interconnect structure as claimed in claim 1, wherein the conductive layer comprises copper.

4. The interconnect structure as claimed in claim 1, wherein the portion of the liner layer formed on sidewalls of the low-k dielectric layer exposed by the trench and via portions comprise nitrogen-free material.

5. The interconnect structure as claimed in claim 1, wherein the conductive barrier layer comprises Ta, TaN or combination thereof.

6. The interconnect structure as claimed in claim 1, wherein the liner layer has a thickness of 100-300 Å.

7. The interconnect structure as claimed in claim 1, wherein the portion of the liner layer on the bottom surface of the low-k dielectric layer exposed by the trench portion comprise nitrogen-containing material.

8. The interconnect structure as claimed in claim 1, wherein the portion of the liner layer formed on sidewalls of the low-k dielectric layer exposed by the trench and via portions and the portion of the liner layer on the bottom surface of the low-k dielectric layer exposed by the trench portion are simultaneously formed.

9. The interconnect structure as claimed in claim 1, wherein the portion of the liner layer formed on sidewalls of the low-k dielectric layer exposed by the trench and via portions and the portion of the liner layer on the bottom surface of the low-k dielectric layer are formed as a single layer.

10. The interconnect structure as claimed in claim 1, wherein the interconnect structure is fabricated by following steps, comprising:
   providing a substrate with a low-k dielectric layer thereon;
   forming an opening in the low-k dielectric layer, comprising an via portion and a trench portion, wherein the trench portion is formed over the via opening and the via portion exposes a portion of the substrate;
   forming a liner layer on sidewalls of the low-k dielectric layer exposed by the trench and via portions and a bottom surface exposed by the trench via portion, wherein the portion of the liner layer on sidewalls of the low-k dielectric layer exposed by the trench and via portions and the portion of the liner layer formed on a bottom surface exposed by the trench portion comprise different materials;
   forming a conductive barrier layer in the trench and via portions, conformally covering the liner layer and the exposed portion of the substrate; and
   forming a conductive layer on the conductive barrier layer, filling in the trench and via openings.

11. A semiconductor structure, comprising:
   a dual damascene structure, comprising:
      a substrate with a low-k dielectric layer thereon;
      a via opening and a trench opening formed in the low-k dielectric layer, wherein the trench opening is formed over the via opening and the via opening exposes a portion of the substrate;
      a liner layer formed on sidewalls of the low-k dielectric layer exposed by the trench and via portions and a bottom surface exposed by the trench via portion, wherein the portion of the liner layer on sidewalls of the low-k dielectric layer exposed by the trench and via portions and the portion of the liner layer formed on a bottom surface exposed by the trench portion comprise different materials;
      a conformal conductive barrier layer formed in the trench and via openings, covering the liner layer and the exposed portion of the substrate; and
      a conductive layer formed on the conductive barrier layer, filling in the trench and via openings; and
   a passivation layer formed over the dual damascene structure.

12. The semiconductor structure as claimed in claim 11, wherein the low-k dielectric layer comprises porous low-k material.

13. The semiconductor structure as claimed in claim 11, wherein the portion of the liner layer formed on sidewalls of the low-k dielectric layer exposed by the trench and via portions comprise nitrogen-free material.

14. The semiconductor structure as claimed in claim 11, wherein the portion of the liner layer on the bottom surface of the low-k dielectric layer exposed by the trench portion comprise nitrogen-containing material.

15. The semiconductor structure as claimed in claim 11, wherein the portion of the liner layer formed on sidewalls of the low-k dielectric layer exposed by the trench and via portions and the portion of the liner layer on the bottom surface of the low-k dielectric layer exposed by the trench portion are simultaneously formed.

16. An interconnect structure, comprising:
   a substrate with a low-k dielectric layer thereon;
   a via opening and a trench opening formed in the low-k dielectric layer, wherein the trench opening is formed over the via opening and the via opening exposes a portion of the substrate; and
   a liner layer formed on sidewalls of the low-k dielectric layer exposed by the trench and via portions and a bottom surface exposed by the trench via portion, wherein the portion of the liner layer on sidewalls of the low-k dielectric layer exposed by the trench and via portions and the portion of the liner layer formed on a bottom surface exposed by the trench portion comprise different materials.

17. The interconnect structure as claimed in claim 16, wherein the low-k dielectric layer comprises porous low-k material.

18. The interconnect structure as claimed in claim 16, wherein the portion of the liner layer formed on sidewalls of the low-k dielectric layer exposed by the trench and via portions comprise nitrogen-free material.

19. The interconnect structure as claimed in claim 16, wherein the portion of the liner layer on the bottom surface of the low-k dielectric layer exposed by the trench portion comprise nitrogen-containing material.

20. The interconnect structure as claimed in claim 16, wherein the liner layer has a thickness of 100-300 Å.

21. The interconnect structure as claimed in claim 16, wherein the portion of the liner layer formed on sidewalls of the low-k dielectric layer exposed by the trench and via portions and the portion of the liner layer on the bottom surface of the low-k dielectric layer exposed by the trench portion are simultaneously formed.

\* \* \* \* \*